(12) United States Patent
Wu et al.

(10) Patent No.: US 6,816,384 B2
(45) Date of Patent: Nov. 9, 2004

(54) HANDHELD DEVICE WITH ELECTROSTATIC DISCHARGE PROTECTION

(75) Inventors: James Wu, Yi-Lan County (TW); Morgan Liu, Tao-Yuan (TW); Steven Peng, Tao-Yuan County (TW)

(73) Assignee: High Tech Computer, Corp., Tao Yuan (TW)

( * ) Notice: Subject to any disclaimer, the term of this patent is extended or adjusted under 35 U.S.C. 154(b) by 0 days.

(21) Appl. No.: 10/249,591

(22) Filed: Apr. 22, 2003

(65) Prior Publication Data

US 2004/0057218 A1 Mar. 25, 2004

(30) Foreign Application Priority Data

Sep. 23, 2002 (TW) ........................................ 91121716 A

(51) Int. Cl.[7] .............................. H05K 5/00; H05K 5/04; H05K 5/06
(52) U.S. Cl. ........................ 361/759; 361/740; 361/747; 361/801
(58) Field of Search ................................. 361/737, 753, 361/799, 816, 818, 212, 220, 724–728, 732, 740, 741, 747, 752, 756, 759, 796, 800–803, 807, 809, 683–686; 174/35 R, 35 GC

(56) References Cited

U.S. PATENT DOCUMENTS

| 4,680,676 A | * | 7/1987 | Petratos et al. ............. 361/818 |
| 5,432,626 A | * | 7/1995 | Sasuga et al. ................ 349/58 |

* cited by examiner

Primary Examiner—Phuong T. Vu
(74) Attorney, Agent, or Firm—Jiang Chyun IP Office

(57) ABSTRACT

A structure for a handheld device with a function of electrostatic discharge (ESD) protection has a circuit member (230), a displaying member (240), and a conductive supporting frame (250) with a hollow region (251). The circuit member and the displaying member are affixed to the conductive supporting frame at the hollow region to construct a subassembly (300). The subassembly is then mounted in a housing (202) consisting of upper and lower housings (210,212) at a location that the conductive supporting frame is just beside a gap (203) between the upper and lower housings. ESD-sensitive components (231,232) on the circuit member and the displaying member are surrounded by the conductive supporting frame, whereby ESD entering the housing via the gap which may cause a harm to the ESD-sensitive components and the displaying member is absorbed by the supporting frame and transmitted to ground via an electrical connection between the supporting frame and ground trace of the circuit member. The handheld device can be a personal digital assistant.

9 Claims, 4 Drawing Sheets

HANDHELD DEVICE WITH ELECTROSTATIC DISCHARGE PROTECTION

CROSS REFERENCE TO RELATED APPLICATIONS

This application claims the priority benefit of Taiwan application serial no. 91121716, filed on Sep. 23, 2002.

BACKGROUND OF INVENTION

1. Field of Invention

The present invention generally relates to technology for manufacturing a handheld device. More particularly, the invention relates a handheld device, such as a personal digital assistant (PDA), with function of electrostatic discharge (ESD) protection. The handheld device can be tested before assembly of a housing thereof.

2. Description of Related Art

As the great improvement of processor performance and the great development of the Internet and multi-media technologies, the electronic products have been a part of the life with strong relation. Portable computing and communication devices are quickly becoming ubiquitous tools for both business and personal activities. The smallest and lightest of these devices are suitable for and most often carried and operated while being held in the hand of its user. A handheld electronic device, such as the PDA, now has become more and more common in today's society. The term PDA refers generally to mobile computer systems, typically handheld, which users employ for a variety of tasks such as storing telephone and address lists (databases), calendaring information, task (i.e., to-do) lists, etc. Some PDAs also incorporate a wireless communication link, allowing the unit to operate as a portable facsimile device, Internet access device and/or pager.

Usually, a handheld device includes a circuit part, such as a printed circuit board (PCB) part, and a displaying part, such as a liquid crystal displaying module (LCDM). Both the circuit part and the displaying part are assembled into a handheld housing. Taking a PDA 100 as an example for the handheld device, as shown in FIG.1, the PDA 100 includes an LCDM 130, a PCB 140 and a housing, in which the LCDM 130 and the PCB 140 are assembled inside the housing after assembling.

In order to allow the LCDM 130 and the PCB 140 to be assembled inside the housing, conventionally, the housing is divided into an upper housing 110 and a lower housing 120. The LCDM 130 is affixed to the upper housing 110 via several screws 150. Likewise, the PCB 140 is affixed to the lower housing 120 via several screws 160. In order to allow the screws 150, 160 to hold the LCDM 130 and the PCB 140 and affix them to the housing, it needs additional securing pieces 170 in the upper and lower housings 110, 120 engaging with the screws 150, 160, as shown in FIG. 2. FIG. 2 is a cross-sectional view, schematically illustrating the PDA after being assembled. The housing needs the securing pieces 170 to threadedly engage with the screws 150, 160. After the LCDM 130 and the PCB 140 are respectively affixed to the upper housing 110 and the lower housing 120, the upper housing 110 and the lower housing 120 are assembled together. A data bus connection member (not shown) is used to electrically connect the LCDM 130 and the PCB 140 together to form a data transmission path.

The LCDM 130 and the PCB 140 include many electronic devices, which are usually sensitive to electrostatic discharges (ESD). Thus, an ESD protection is required for the PDA 100. Nevertheless, the structure of the conventional PDA 100 cannot provide a reliable and simple ESD protection.

Furthermore, in this conventional structure, the assembling procedure is tedious. Moreover, after the LCDM 130 and the PCB 140 are assembled to the housings 110, 120 of the PDA 100, usually the PDA is necessary to be tested, such as/mechanical electrical test, before distributing the PDA to the market. The test is to assure that the PDA is firmly assembled together and the electrical connection thereof is proper. In other words, the PDA distributed in the market should satisfy some predetermined requirements.

If the PDA cannot satisfy the predetermined requirements, it needs repair, such as replacing the PCB 140 or the LCDM 130. As foregoing descriptions, the conventional structure of the PDA 100 needs a tedious assembling procedure. Accordingly, the procedure for repairing the PDA 100 is also tedious, which causes the conventional PDA 100 to have a high manufacturing cost.

In addition, the ESD protection of the conventional PDA 100 is achieved by employing an individual element of the PDA. Such an individual element not only increases the tedious assembling procedure, but also may increase the size of the PDA.

SUMMARY OF INVENTION

One objective of the present invention is to provide a handheld device with the capability of ESD protection, wherein the ESD protection element is an integral part of a subassembly for mounting a circuit member and a displaying member of the handheld device. As a result, the present invention does not need an additional element for achieving the ESD protection.

Another objective of the present invention is to provide a handheld device, in which a PCB member and a displaying module can be firmly affixed together on a supporting frame so that the handheld device can have a robust structure.

Another objective of the present invention is to provide a handheld device, in which a PCB member and a displaying module are first assembled together before they are mounted in a housing of the handheld device. In this manner, a test can be performed when the PCB member and displaying module are exposed. Thus, the PCB member or the displaying module can be easily repaired or replaced if it is found with problem during the test.

To achieve the objectives set forth above, a handheld device in accordance with the present invention comprises a circuit member, a displaying member, and a conductive supporting frame with a hollow region. The circuit member and the displaying member are affixed to the conductive supporting frame at the hollow region. The supporting frame surrounds ESD-sensitive components of the circuit member and the displaying member to thereby provide ESD protection to the ESD-sensitive components of the circuit member and the displaying member.

In the foregoing structure of the handheld device, the circuit member includes a plurality of first holes. The displaying member includes a plurality of second holes. The conductive supporting frame includes a plurality of threaded holes. The circuit member and the displaying member are affixed to the supporting frame respectively on and in the hollow region by extending screws respectively through the first holes as well as the second holes to secure in the threaded holes.

The handheld device further includes a housing to hold therein a subassembly consisting of the circuit member, the displaying member, and the conductive supporting frame. The circuit member includes a printed circuit board (PCB) member and the displaying member includes a liquid crystal displaying module (LCDM). The housing consists of upper and lower housings with a gap therebetween. The conductive supporting frame is located just beside the gap.

The invention also provides an assembling method for a handheld device, which includes a circuit member, a displaying member, an upper housing, and a lower housing. The method comprises providing a conductive supporting frame, which has a hollow region. The displaying member and the circuit member are affixed to the conductive supporting frame at the hollow region, whereby the conductive support frame surrounds the displaying member and ESD-sensitive components of the circuit member to provide ESD protection thereto. The upper housing, the lower housing, and the conductive supporting frame with the displaying member and the circuit member are assembled to form the handheld device, wherein the upper housing and the lower housing form a housing of the handheld device receiving the supporting frame, circuit member and displaying member therein.

BRIEF DESCRIPTION OF DRAWINGS

The accompanying drawings are included to provide a further understanding of the invention, and are incorporated in and constitute a part of this specification. The drawings illustrate an embodiment of the invention, and together with the description, serve to explain the principles of the invention. In the drawings.

DETAILED DESCRIPTION

For a handheld device, one of the main features of the invention is using a supporting frame, to which a circuit member, such as printed circuit board (PCB), and a displaying member, such as a liquid crystal display module (LCDM), are affixed. The supporting frame can also be a conductive supporting frame, wherein after the circuit member and the display member are assembled on the conductive supporting frame, the conductive supporting frame surrounds them and provides an additional function of electrostatic discharge (ESD) protection. An embodiment is provided as an example for describing the features of the invention.

Figure 1:
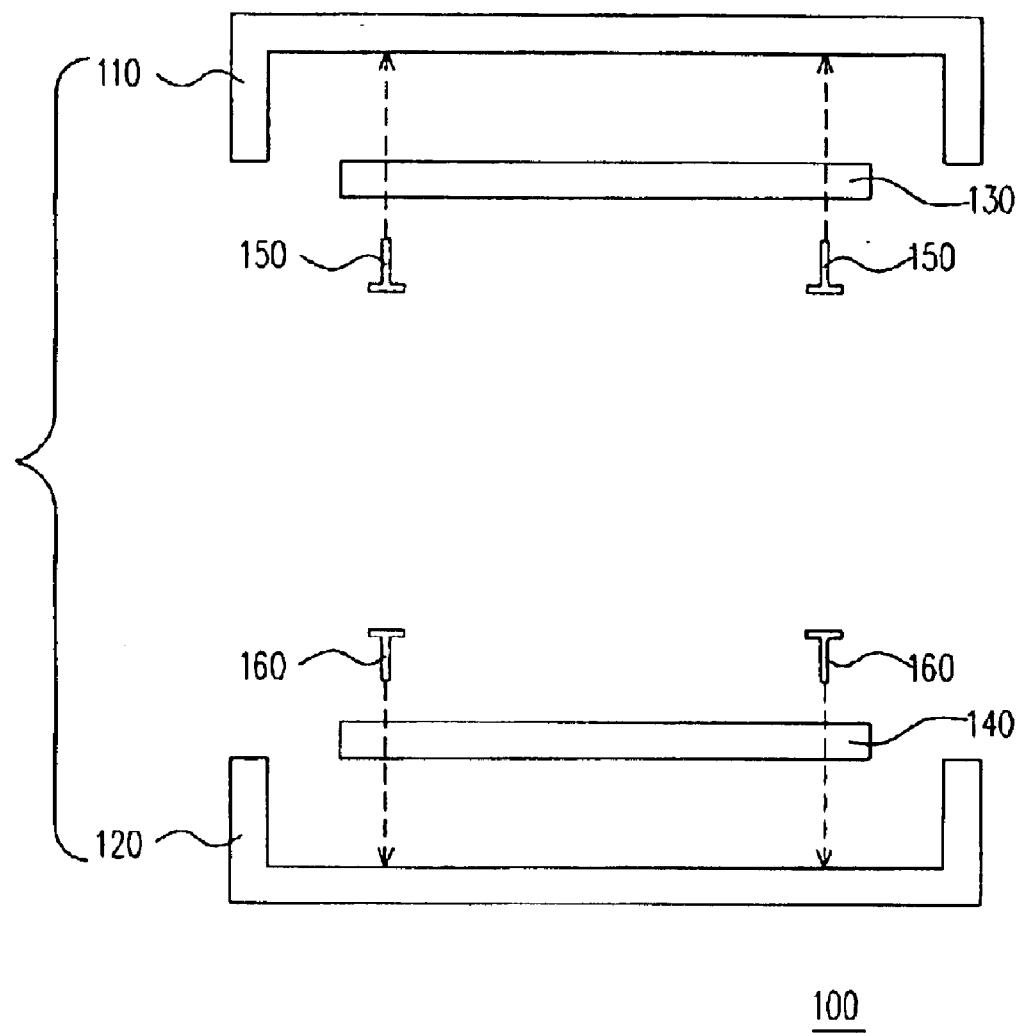
FIG. 1 is an exploded, cross-sectional view, schematically illustrating a conventional PDA.
Figure 2:
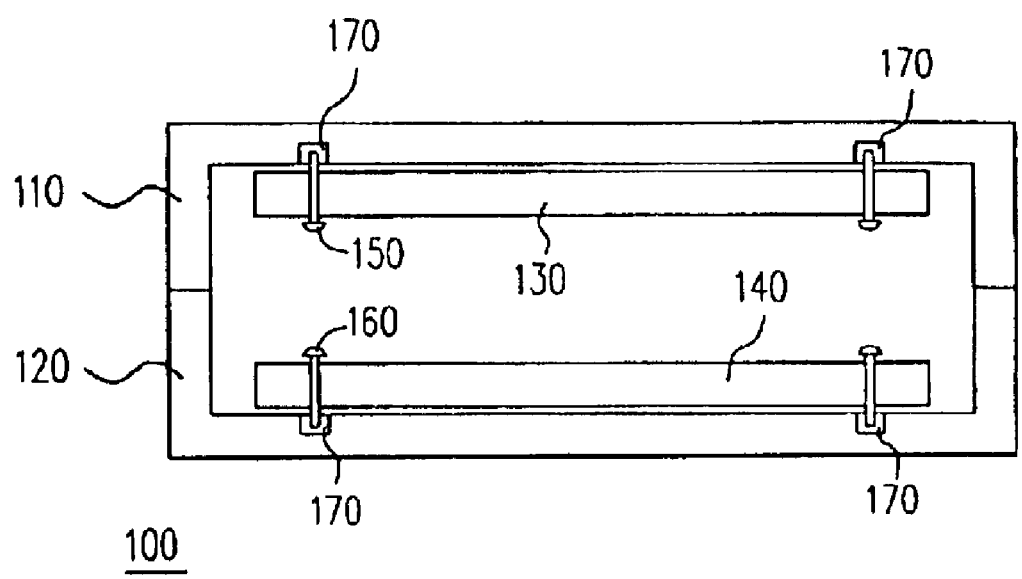
FIG. 2 is a cross-sectional view, schematically illustrating the conventional PDA after being assembled.
Figure 3:
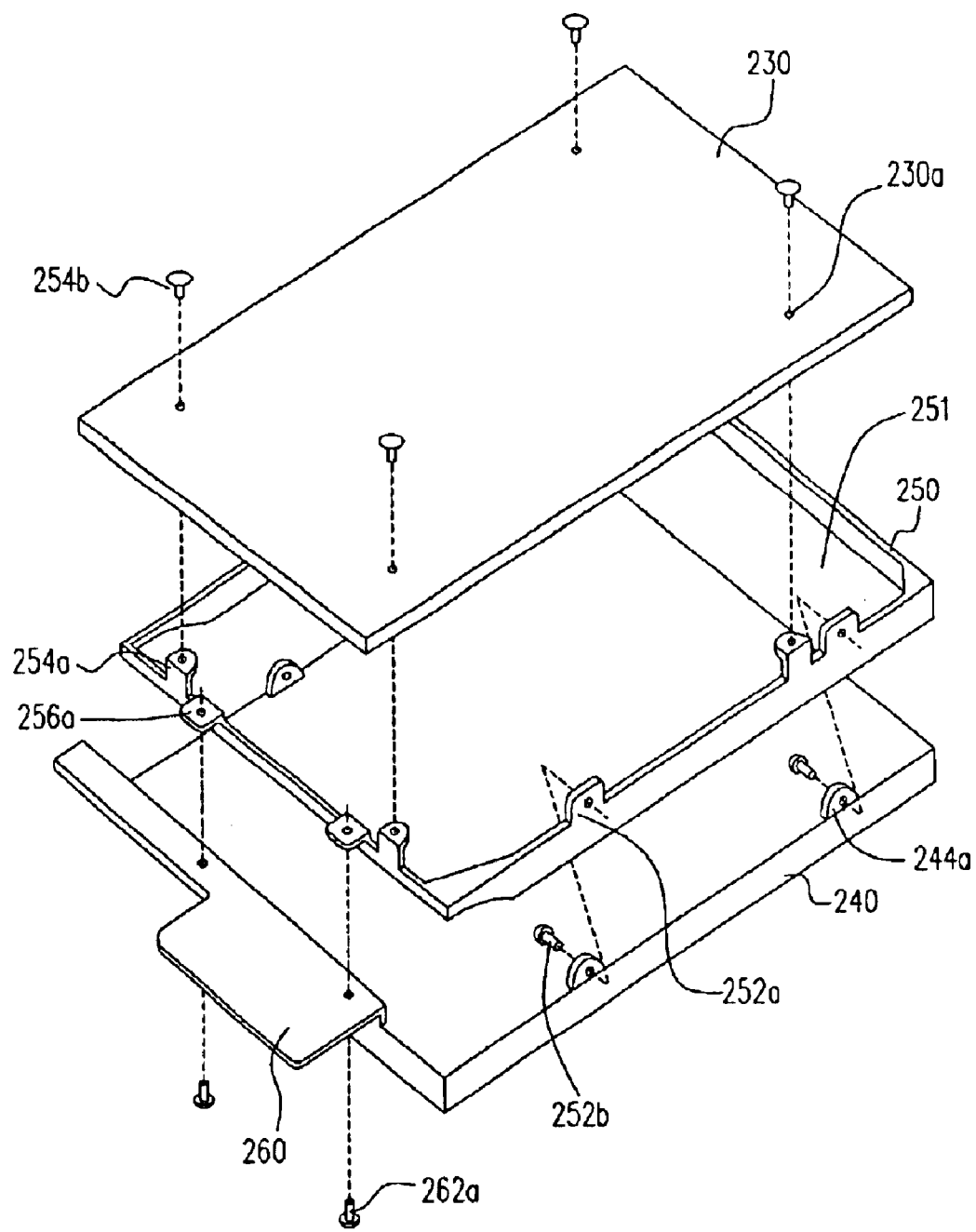
FIG. 3 is a perspective, exploded view, schematically illustrating constituting elements of a subassembly of a handheld device according to the present invention.

Referring to FIG. 3, a handheld device, such as a PDA according to the present invention includes a supporting frame 250. The supporting frame 250 preferably is a conductive supporting frame, which is made of metal such as ferrous alloy. The supporting frame 250 is designed to have a central hollow region 251. The supporting frame 250 is also designed with a number of horizontally extending ears 254a and vertically extending ears 252a. Each of the ears 254a, 252a defines a threaded hole therein.

The handheld device also includes a circuit member 230, on which the related circuit used in the handheld device is formed. The circuit member 230 can be, for example, a printed circuit board member with electronic components thereon. The circuit member 230 is designed to have a number of holes 230a, which are correspondent to the threaded holes in the horizontally extending ears 254a of the supporting frame 250. The circuit member 230 is affixed to the supporting frame 250 by extending the screws 254b through the holes 230a of the circuit member 230 to lock into the threaded holes in the ears 254a. When the screws 254b are tightly screwed to the ears 254a, the circuit member 230 is firmly affixed to the supporting frame 250.

Since the circuit member 230 includes so many electronic components, which are sensitive to the ESD. If an ESD occurs on these electronic components, these electronic components may be damaged. Conventionally, it needs an additional ESD protection piece for the handheld device. Differently, the present invention does not need the conventional additional ESD protection piece. Instead, the supporting frame 250 itself is designed to have the ESD protection capability. In this design, the supporting frame 250 is designed to have the hollow region 251. The electronic components of the circuit member 230, which are sensitive to ESD, such as a CPU 232 and a memory module 231 (FIGS. 4 and 5) are mounted to a bottom face of the circuit member 230. As a result, when the circuit member 230 is mounted to the supporting frame 250, these ESD-sensitive electronic components 232, 231 are received in the hollow region 250 and surrounded by the supporting frame 250; thus, these components 232, 231 can be protected from ESD by the supporting frame 250. An ESD possibly attacking these components 232, 231 is first absorbed by the supporting frame 250 and transmitted to ground via an electrical connection between ground circuit of the circuit member 230 and the ears 254a of the supporting frame 250.

After the circuit member 230 is affixed to the supporting frame 250, a displaying member 240 is then assembled to the supporting frame 250. The displaying member 230 is provided with a number of vertically extending mounting ears 244a, which are correspondent to the ears 252a of the supporting frame 250, and each of which is provided with a hole therein. Then, screws 252b are brought to extend through the holes in the mounting ears 244a of the displaying member 240 to secure in the threaded holes in the ears 252a of the supporting frame 250. After assembly, the display member 240 which is sensitive to ESD is received in the hollow region 251 and surrounded by the supporting frame 250, whereby the display member 240 can obtain a better protection from ESD. An auxiliary circuit member 260 is mounted to an end of the supporting frame 250. The supporting frame 250 forms horizontally extending ears 256a at the end portion. Screws 262a are used to extend through holes in the auxiliary circuit member 260 and secure in threaded holes of the ears 256a.

Figure 4:
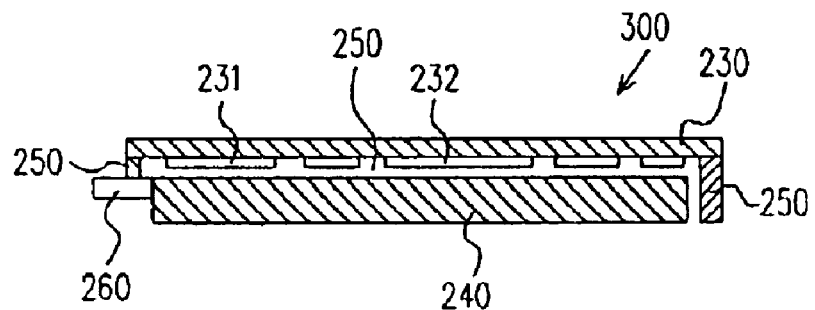
FIG. 4 is a cross-sectional view, schematically illustrating the subassembly of FIG. 3, after being assembled.

FIG. 4 is a cross-sectional view, schematically illustrating the circuit member 230, the supporting frame 250, the display member 240 and the auxiliary circuit member 260 of the handheld device being assembled together to form a subassembly. In FIG. 4, after the circuit member 230, the auxiliary circuit member 260 and the displaying member 240 are affixed to the supporting frame 250, a very compact and robust subassembly 300 is formed. In the present invention, since the circuit member 230 and the displaying member 240 are affixed to the supporting frame 250, the possibility of relative movement between the circuit member 230 and the displaying member 240 is reduced. This can significantly improve the assembling quality.

Then, a test procedure for the handheld device can be performed to the subassembly 300. This is also one of the advantages of the present invention. Since the circuit member 230 and the displaying member 240 are assembled together before they are mounted in a housing, if any of them is found during the test, it can be repaired or replaced by a proper one easily.

Figure 5:
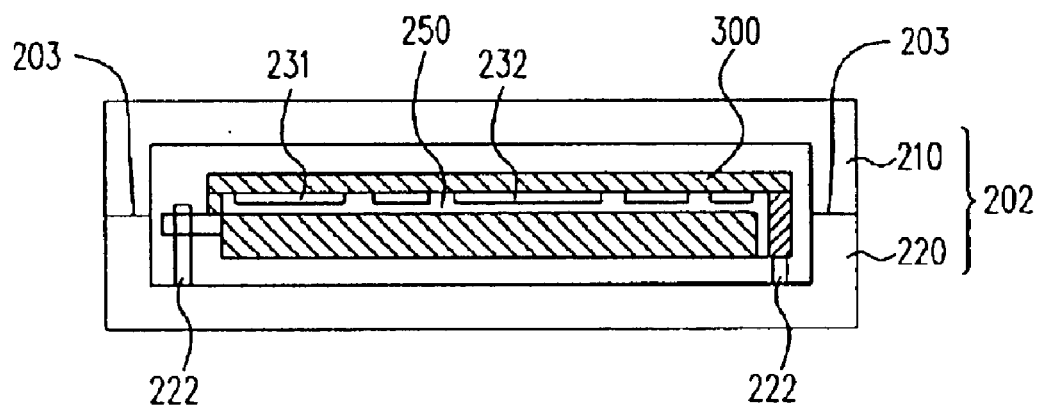
FIG. 5 is a cross-sectional view, schematically illustrating the subassembly of FIG. 4 being assembled in a housing of the handheld device.

After the subassembly 300 has passed the test, the subassembly 300 is then mounted into a housing 202 as shown in FIG. 5. The housing 202 consists of an upper housing 210 and a lower housing 220. The subassembly 300 is secured in the housing 300 by affixing members 222, which interconnect the subassembly 300 and the lower housing 220, and which could be bolts. When the subassembly 300 is mounted in the housing 202, the supporting frame 250 is located just beside a gap 203 between the upper and lower housings 210, 220; thus, an ESD into the housing 202 via the gap 203 hits directly on the supporting frame 205 and is then grounded by an electrical connection between the ears 254a of the supporting frame 250 and the ground circuit of the circuit member 230. Thus, the ESD-sensitive components 231, 232 of the circuit member 230 and the display member 240 are protected by the supporting frame 250 from the ESD attack since they are surrounded by the supporting frame 250.

In summary, the present invention at least has following advantages:

1. The handheld device uses the supporting frame 250 to mount the circuit member 230 and the displaying member 240. Since the supporting frame 250 is mad of conductive material, located near the gap 203 between the upper and lower housings 210, 220 of the housing 202, and configured to surround the ESD-sensitive components 231, 232 of the circuit member 230 and the display member 240, the supporting frame 250 can provide ESD protection function to the handheld device in accordance with the present invention.

2. Since the circuit member 230 and the displaying member 240 are assembled together before they are mounted in the housing 202, a repair or replacement of the circuit member 240 or the display member 230 can be easily conducted if a problem is found therein when a test is conducted to the subassembly 300.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A handheld device, comprising:

a circuit member having electronic components mounted thereon;

a displaying member; and a conductive supporting frame with a hollow region;

wherein the circuit member and the displaying member are affixed to the conductive supporting frame at the hollow region, and the electronic components and the displaying member are surrounded by the conductive supporting frame, whereby the conductive supporting frame also provides a function of ESD protection to the displaying member and the electronic components;

wherein the circuit member includes a plurality of first holes;

the displaying member includes a plurality of second holes; and the conductive supporting frame includes a plurality of threaded holes formed thereon;

wherein the circuit member and the displaying member arc affixed to the supporting frame by using screws, which respectively extend through the first holes as well as the second holes and arc locked to the threaded holes.

2. The handheld device of claim 1, further comprising a housing to hold the circuit member, the displaying member, and the conductive supporting frame therein.

3. The handheld device of claim 1, wherein the circuit member includes a printed circuit board (PCB) member.

4. The handheld device of claim 1, wherein the displaying member includes a liquid crystal displaying module (LCDM).

5. The handheld device of claim 1, wherein the handheld device is a personal digital assistant (PDA) product.

6. A handheld device, comprising:

a circuit member having thereon electronic components sensitive to electrostatic discharge (ESD);

a displaying member; and a conductive supporting frame connected to ground and defining a hollow region therein, wherein the circuit member and the displaying member are affixed to the supporting frame at the hollow region to form a subassembly, wherein the ESD-sensitive components are surrounded by the supporting frame; and a housing accommodating the subassembly therein;

wherein the housing consists of upper and lower housings with a gap therebetween, and the supporting frame is located beside the gap.

7. The handheld device of claim 6, wherein the displaying member is also surrounded by the supporting frame.

8. The handheld device of claim 7, wherein the displaying member is a liquid crystal displaying module (LCDM).

9. The handheld device of claim 8, wherein the handheld device is a personal digital assistant (PDA).

* * * * *